United States Patent
Lee et al.

(10) Patent No.: US 10,224,482 B2
(45) Date of Patent: *Mar. 5, 2019

(54) MASKS, METHOD TO INSPECT AND ADJUST MASK POSITON, AND METHOD TO PATTERN PIXELS OF ORGANIC LIGHT-EMITTING DISPLAY DEVICE UTILIZING THE MASKS

(71) Applicant: Samsung Display Co., Ltd., Yongin-si (KR)

(72) Inventors: Sangshin Lee, Yongin-si (KR); Dongjin Ha, Yongin-si (KR); Mingoo Kang, Yongin-si (KR); Ohseob Kwon, Yongin-si (KR); Sangmin Yi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/630,877

(22) Filed: Jun. 22, 2017

(65) Prior Publication Data

US 2017/0288143 A1 Oct. 5, 2017

Related U.S. Application Data

(63) Continuation of application No. 14/883,989, filed on Oct. 15, 2015, now Pat. No. 9,705,082.

(30) Foreign Application Priority Data

May 19, 2015 (KR) .................. 10-2015-0069351

(51) Int. Cl.
*H01L 51/00* (2006.01)
*H01L 51/56* (2006.01)
(Continued)

(52) U.S. Cl.
CPC ...... *H01L 51/0011* (2013.01); *H01L 27/3211* (2013.01); *H01L 27/3223* (2013.01);
(Continued)

(58) Field of Classification Search
CPC .. H01L 51/0011; H01L 27/3211; H01L 51/56; H01L 27/1288; H01L 27/3244;
(Continued)

(56) References Cited

U.S. PATENT DOCUMENTS 9,705,082 B2 * 7/2017 Lee ................ H01L 27/3223
2010/0026173 A1 2/2010 Lhee et al.
2014/0071030 A1 3/2014 Lee

FOREIGN PATENT DOCUMENTS

KR 10-1999-0031827 5/1999
KR 10-2007-0072271 7/2007
(Continued)

OTHER PUBLICATIONS

Notice of Allowance dated Dec. 27, 2016, in U.S. Appl. No. 14/883,989.
(Continued)

*Primary Examiner* — Caleen Sullivan
(74) *Attorney, Agent, or Firm* — H.C. Park & Associates, PLC

(57) ABSTRACT

A method for pixel patterning and pixel position inspection of an organic light-emitting display device includes: forming, on a substrate using a first mask, a thin film layer of a first color corresponding to a first pixel pattern and a first pixel positioning pattern for inspecting a position of a first pixel; shifting, by a determined pitch, the first mask from a position associated with forming the thin film layer of the first color; aligning the shifted first mask with respect to the substrate; and forming, on the substrate using the shifted first mask, a thin film layer of a second color corresponding to the
(Continued)

first pixel pattern and another first pixel positioning pattern for inspecting a position of a second pixel.

17 Claims, 9 Drawing Sheets

(51) Int. Cl.
    *H01L 27/32*     (2006.01)
    *H01L 51/50*     (2006.01)

(52) U.S. Cl.
    CPC .......... *H01L 51/56* (2013.01); *H01L 51/5012* (2013.01); *H01L 51/5088* (2013.01)

(58) Field of Classification Search
    CPC ... H01L 27/12; H01L 51/5056; H01L 27/322; H01L 27/3262; H01L 27/3218; H01L 27/3248; H01L 51/0008; H01L 51/5036; H01L 31/0481; H01L 51/5088; H01L 51/5012; C23C 14/042; C23C 14/12; C23C 14/24; H05B 33/10; C08L 33/02; C08L 79/02; C08L 2203/204; C08K 3/346
    USPC .......................................................... 438/14
    See application file for complete search history.

(56) References Cited

FOREIGN PATENT DOCUMENTS

| KR | 10-2010-0015176 | 2/2010 |
| KR | 10-2014-0035239 | 3/2014 |
| KR | 10-2014-0086346 | 7/2014 |

OTHER PUBLICATIONS

Notice of Allowance dated Mar. 7, 2017, in U.S. Appl. No. 14/883,989.

Notice of Allowance dated Apr. 10, 2017, in U.S. Appl. No. 14/883,989.

* cited by examiner

FIG. 4C
FIG. 4D
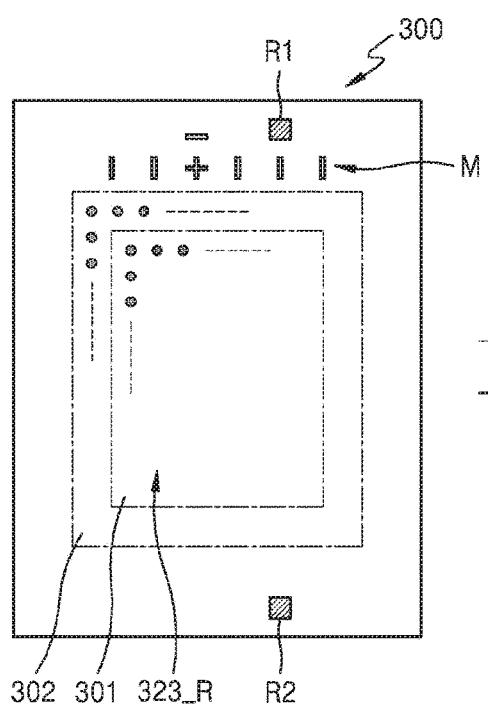
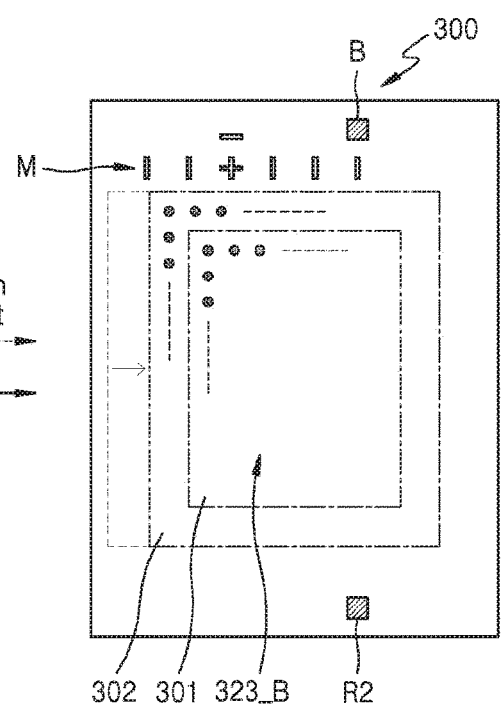

MASKS, METHOD TO INSPECT AND ADJUST MASK POSITON, AND METHOD TO PATTERN PIXELS OF ORGANIC LIGHT-EMITTING DISPLAY DEVICE UTILIZING THE MASKS

CROSS-REFERENCE TO RELATED APPLICATION

This application is a Continuation of U.S. patent application Ser. No. 14/883,989, filed Oct. 15, 2015, and claims priority from and the benefit of Korean Patent Application No. 10-2015-0069351, filed May 19, 2015, each of which is incorporated by reference for all purposes as if fully set forth herein.

BACKGROUND

Field

Exemplary embodiments relate to formation of thin films, and, more particularly, to a mask and a method of forming and inspecting the position accuracy of a thin film pattern via a deposition process utilizing the mask.

Discussion

Vapor deposition typically involves generating vapor from a deposition source and allowing the vapor to adhere to a substrate surface. For instance, a mask may be disposed on (or over) a substrate, and vapor from a deposition source may be allowed to pass through openings in a mask and on the substrate to form a desired thin film pattern on the substrate. Such thin film manufacturing techniques may be used to form thin film pattern associated with flat panel display devices, such as an organic light-emitting device (OLED). For example, the thin film pattern may correspond to a thin film pixel pattern.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a mask used to form a thin film pixel pattern for an organic light-emitting display device.

Exemplary embodiments provide a method for pixel patterning and inspecting pixel positioning in an organic light-emitting display device.

Additional aspects will be set forth in part in the description which follows, and, in part, will be apparent from the disclosure, or may be learned by practice of the inventive concept.

According to one or more exemplary embodiments, a method for pixel patterning and pixel position inspection of an organic light-emitting display device includes: forming, on a substrate using a first mask, a thin film layer of a first color corresponding to a first pixel pattern and a first pixel positioning pattern for inspecting a position of a first pixel; shifting, by a determined pitch, the first mask from a position associated with forming the thin film layer of the first color; aligning the shifted first mask with respect to the substrate; and forming, on the substrate using the shifted first mask, a thin film layer of a second color corresponding to the first pixel pattern and another first pixel positioning pattern for inspecting a position of a second pixel.

According to one or more exemplary embodiments, a pixel patterning mask for an organic light-emitting display device includes: a pixel pattern; a first inspection pattern for inspecting a first pixel position, the first inspection pattern being configured to facilitate measurement of position accuracy of a thin film layer formed on a substrate via the pixel pattern; and a second inspection pattern for inspecting a second pixel position, the second inspection pattern being configured to facilitate measurement of position accuracy of a thin film layer formed on the substrate via the pixel pattern. The second inspection pattern is formed in a different position than the first inspection pattern.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIGS. 4A, 4B, 4C, and 4D illustrate a method of patterning an emission layer of a first pixel and an emission layer of a second pixel using a first mask, according to one or more exemplary embodiments.

DETAILED DESCRIPTION OF THE ILLUSTRATED EMBODIMENTS

Figure 1:
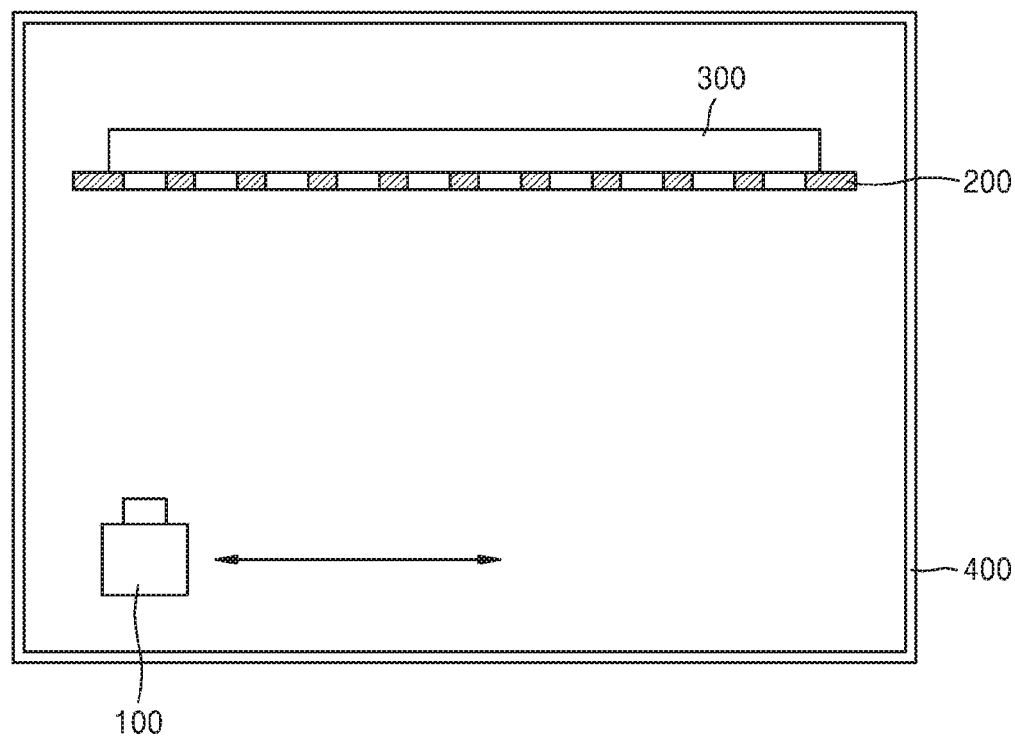
FIG. 1 is a schematic view of a thin film deposition apparatus, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. Unless stated otherwise, a specific process order may be performed differently than described. For example, two consecutively described processes may be performed substantially at the same time or performed in an order opposite to the described order.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic view of a thin film deposition apparatus, according to one or more exemplary embodiments.

As seen in FIG. 1, the thin film deposition apparatus includes a mask 200 for forming a desired pattern on a substrate 300, which is a deposition object, and a deposition source unit 100. The deposition source unit 100 may be configured to reciprocate back and forth inside a chamber 400 and to spray (or otherwise release) a deposition gas toward the substrate 300. Accordingly, when the deposition source unit 100 sprays the deposition gas inside the chamber 400, the deposition gas may pass through openings formed in the mask 200 and may be deposited on the substrate 300 to form a thin film in a determined pattern.

Figure 2:
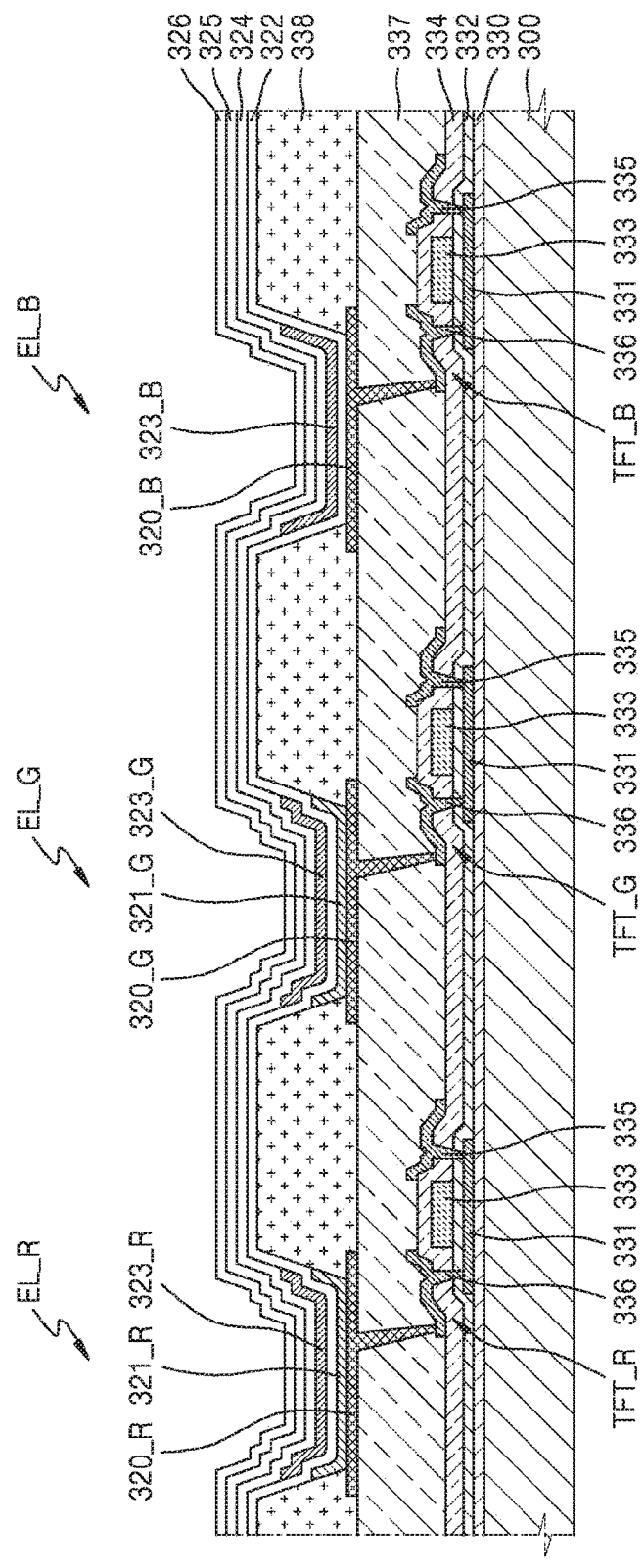
FIG. 2 is a cross-sectional view of a unit pixel structure of an organic light-emitting display device that may be formed via the thin film deposition apparatus of FIG. 1, according to one or more exemplary embodiments.

FIG. 2 is a cross-sectional view of a unit pixel structure of an organic light-emitting display device that may be formed via the thin film deposition apparatus of FIG. 1, according to one or more exemplary embodiments. For example, substrate 300 of FIG. 1 may be substrate 300 of the organic light-emitting display device of FIG. 2. The unit pixel may include three color sub-pixels, e.g., a red (R) sub-pixel, a green (G) sub-pixel, and a blue (B) sub-pixel. It is contemplated, however, that any suitable color and number of sub-pixels may be formed utilized in association with exemplary embodiments described herein. For descriptive convenience, the various sub-pixels of the unit pixel will, hereinafter, be referred to as pixels.

Referring to FIG. 2, the unit pixel may include a buffer layer 330 formed on the substrate 300, a thin film transistor TFT_R for a red pixel R, a thin film transistor TFT_G for a green pixel G, and a thin film transistor TFT_B for a blue pixel B disposed on a surface (e.g., an upper surface) of the buffer layer 330. Each of the thin film transistors TFT_R, TFT_G, and TFT_B may include a semiconductor active layer 331, a gate insulating layer 332 covering the semiconductor active layer 331, and a gate electrode 333 disposed on the gate insulating layer 332, e.g., on an upper surface of the gate insulating layer 332. An interlayer insulating layer 334 is formed to cover the gate electrode 333. A source electrode 335 and a drain electrode 336 are formed on the upper portion of the interlayer insulating layer 334. The source electrode 335 and the drain electrode 336 contact a source region and a drain region of the semiconductor active layer 331, respectively, via corresponding contact holes formed in the gate insulating layer 332 and the interlayer insulating layer 334.

Corresponding pixel electrodes 320_R, 320_G, and 320_B of respective organic light-emitting devices EL_R, EL_G, and EL_B are connected to the source electrodes 335 and drain electrodes 336 of the color pixels, respectively. The respective pixel electrodes 320_R, 320_G, and 320_B may be formed on a planarization layer 337. A pixel-defining layer 338 may cover the pixel electrodes 320_R, 320_G, and 320_B. An interlayer including emission layers 323_R, 323_G, and 323_B and an auxiliary layer is formed on the pixel electrodes 320_R, 320_G, and 320_B. An opposite electrode 326 is formed on the respective interlayers.

The auxiliary layer includes hole injection layers 321_R and 321_G, a hole transport layer 322, an electron transport layer 324, and an electron injection layer 325. As seen in FIG. 2, the hole injection layers 321_R and 321_G are not disposed in association with the blue pixel B, but are disposed in association with the red pixel R and the green pixel G. The hole injection layers 321_R and 321_G are disposed in association with the emission layers 323_R and 323_G. In this manner, the emission layers 323_R and 323_G overlap the hole injection layers 321_R and 321_G. As with the opposite electrode 326, the hole transport layer 322, the electron transport layer 324, and the electron injection layer 325 are common layers formed in association with each pixel region. As such, the opposite electrode 326, the hole transport layer 322, the electron transport layer 324, and the electron injection layer 325 may be formed via an open mask without any specific pattern or, in other words, may be formed to cover an entire surface of an underlying layer on the substrate 300. The emission layer 323_R of the red pixel R and the emission layer 323_B of the blue pixel B have the same pattern, but are spaced apart from one another by a determined pitch corresponding to an interval between the red pixel R and the blue pixel B.

According to one or more exemplary embodiments, a method is provided to form the emission layers 323_R, 323_G, and 323_B and the hole injection layers 321_R and 321_G in accurate positions, with accurate patterning, and with accurate overlapping conditions. In this manner, a mask utilized to form the emission layers 323_R and 323_B may be different than the mask utilized to form the emission layer 323_G. Furthermore, one or more masks utilized to form the hole injection layers 321_R and 321_G may not be utilized to form a portion of the blue pixel B, as the blue pixel B does not include a hole injection layer. To this end, the emission layers 323_R, 323_G, and 323_B and the hole injection layers 321_R and 321_G should be patterned at an accurate positions in each pixel. When, however, a mask is not at an accurate position, the position of a thin film deposited on the substrate 300 may be offset from an expected position and this may reduce the display quality of the pixel. To help prevent (or at least reduce) the potential for such an offset of a mask, the method may include a process of accurately measuring a pixel position to accurately deposit a thin film in association therewith.

Figure 3:
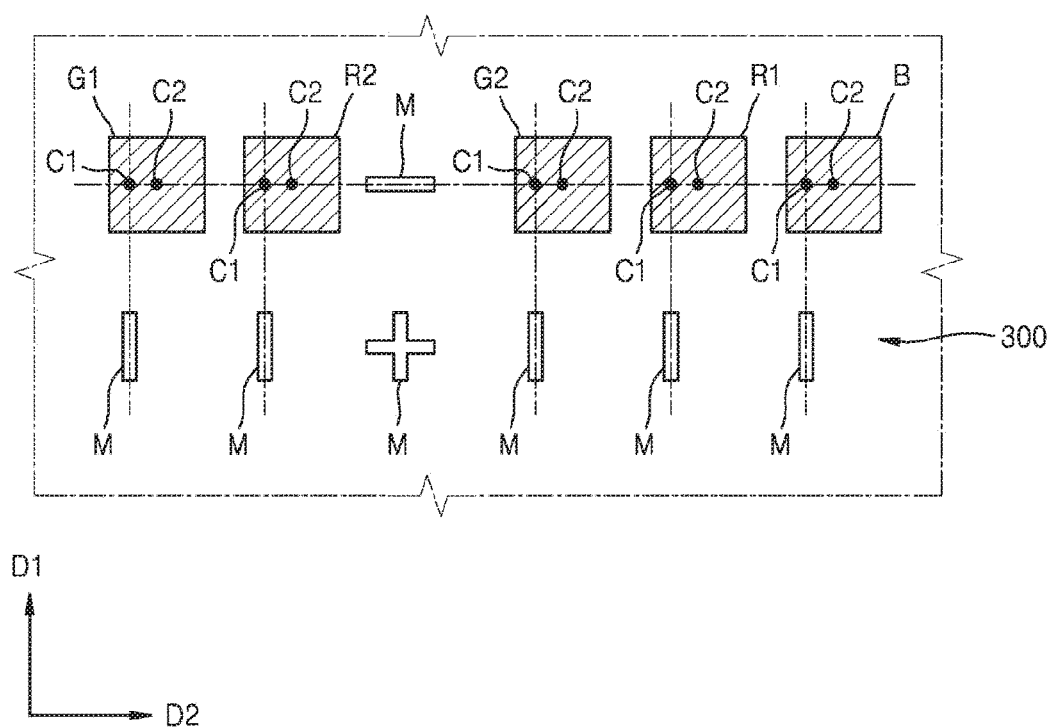
FIG. 3 is a plan view of marks and thin film patterns formed on a substrate that may be utilized to accurately position a mask in association with a pixel for thin film deposition, according to one or more exemplary embodiments.

FIG. 3 is a plan view of marks and thin film patterns formed on a substrate that may be utilized to accurately position a mask in association with a pixel for thin film deposition, according to one or more exemplary embodiments.

Figure 4A:
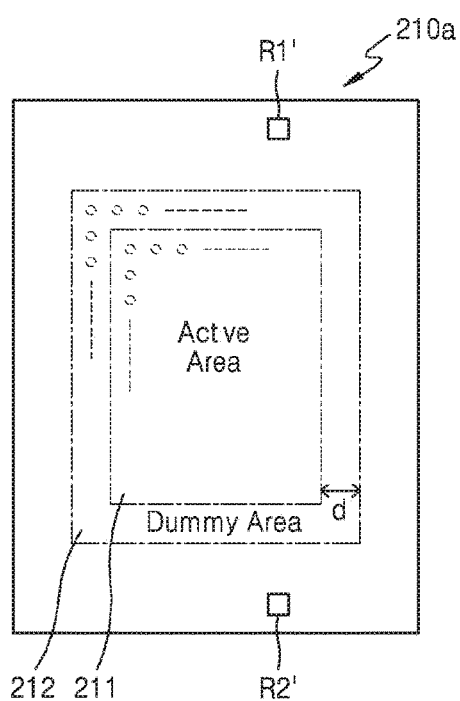
Figure 6A:
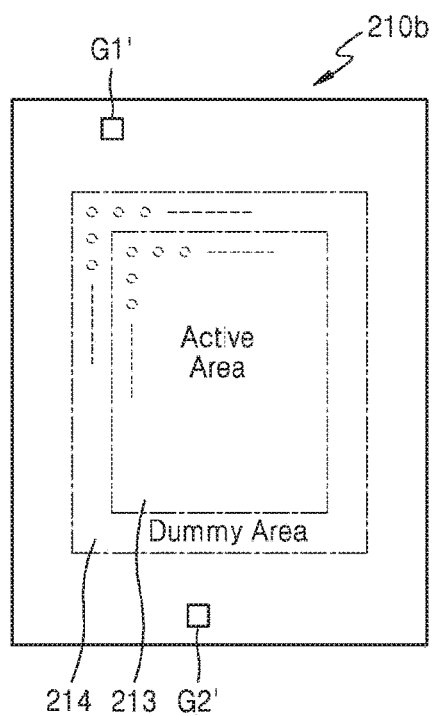
FIGS. 6A, 6B, 6C, and 6D illustrate a method of patterning an emission layer of a third pixel and an auxiliary layer of the third pixel using a second mask, according to one or more exemplary embodiments.
Figure 6B:
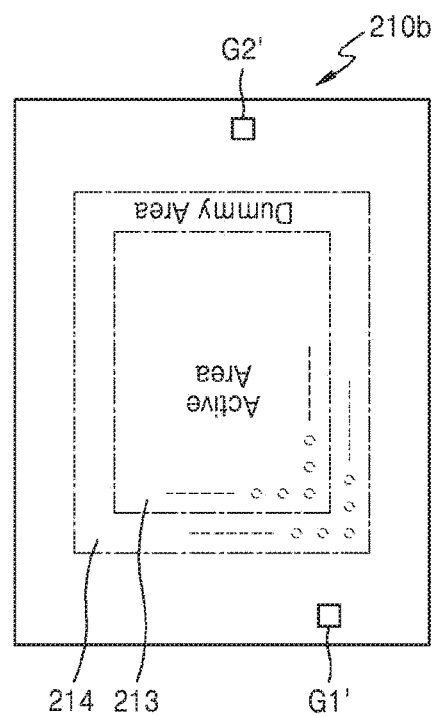
Figure 6C:
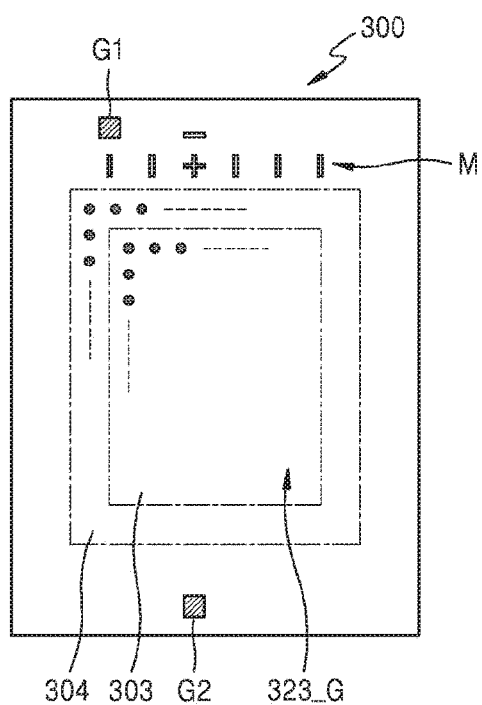
Figure 6D:
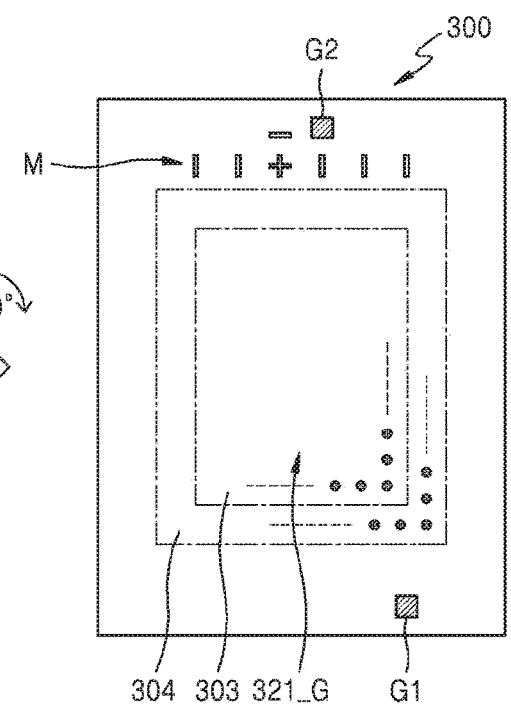

To measure for deposition position accuracy, marks M (as shown in FIG. 3) may be formed on a first side of a substrate 300, and patterns G1', R1', G2', and R2' (as shown in FIGS. 4A and 6A) may be utilized to form thin film layers G1, R1, B, G2, and R2 for inspection. Thin film layers G1, R1, B, G2, and R2 may be formed on reference central points C1 that are aligned in a first direction D1 with virtual extension lines extending from the marks M. In this manner, when the emission layers 323_R, 323_G, and 323_B and the hole injection layers 321_R and 321_G are formed, the thin film layers G1, R1, B, G2, and R2 for inspection may also be deposited and formed on the substrate 300. Accordingly, when the mask is accurately positioned, central points C2 of the thin film layers G1, R1, B, G2, and R2 for inspection will coincide with the reference central points C1 that are associated with the marks M. However, when the mask is not accurately positioned, and, thereby, offset in, for instance, a second direction D2, the central points C2 of the thin film layers G1, R1, B, G2, and R2 for inspection will not coincide with the reference central points C1 associated with the marks M. Instead, a gap interval in the second direction D2 will exist between the reference central points C1 and the central points C2 as exemplified in FIG. 3. The gap interval may be measured as an offset misalignment of the mask. The measured gap interval may be utilized to reposition the mask so that the offset may be removed for a next deposition process.

Although not illustrated, it is also contemplated that one or more marks may be formed on a second side of the substrate 300 that is perpendicular (or substantially perpendicular) to the first side of the substrate 300 (or formed in another portion of the substrate) to measure and adjust for positioning accuracy associated with the first direction D1. That is, a gap interval may also be measured in the first direction D1 based on an offset of the reference central point C1 and the central point C2 in the first direction D1. In this manner, the mask may be accurately positioned in both the first direction D1 and the second direction D2.

An exemplary method to form the emission layers 323_R, 323_G, and 323_B, the hole injection layers 321_R and 321_G, and respective thin film layers G1, R1, B, G2, and R2 for inspection will be described in association with FIGS. 4A, 4B, 4C, 4D, 5A, 5B, 5C, 5D, 6A, 6B, 6C, and 6D.

FIGS. 4A, 4B, 4C, and 4D illustrate a method of patterning an emission layer of a first pixel and an emission layer of a second pixel using a first mask, according to one or more exemplary embodiments. For instance, the emission layer of the first pixel may be emission layer 323_R of a red pixel R and the emission layer of the second pixel may be emission layer 323_B of a blue pixel B. To this end, the first mask will be referred to as mask 210a.

Figure 4B:
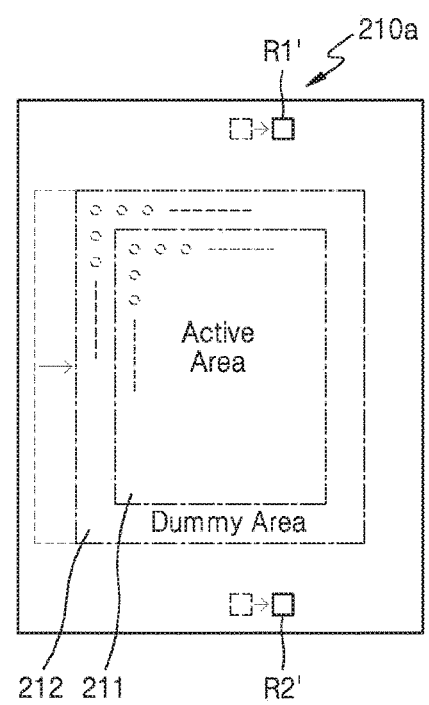

As illustrated in FIGS. 4A and 4B, the first mask 210a may include first pixel patterns in an active area 211 and a dummy area 212 disposed outside the active area 211, a pattern R1' for inspecting a first pixel position, and a pattern R2' for inspecting a second pixel position. The active area 211 is a pattern region for actually forming the emission layers 323_R, 323_G, and 323_B and the hole injection layers 321_R and 321_G. The dummy area 212 is a marginal pattern region disposed outside the active area 211, e.g., surrounding the active area 211. The pattern R1' for inspecting the first pixel position is a pattern for forming a thin film layer R1 for a first inspection, as seen in FIG. 4C. The pattern R1' is formed when the emission layer 323_R of a pixel R is formed. The pattern R2' for inspecting the second pixel position is a pattern for forming a thin film layer R2 for a third inspection, as seen in FIGS. 4C and 4D.

According to one or more exemplary embodiments, the pattern R2' for inspecting the second pixel position may not be used during a process of forming the emission layer 323_R of the red pixel R and the emission layer 323_B of the blue pixel B. For example, the pattern R2' for inspecting the second pixel position may be an opening formed in the first mask 210a, and, as such, the thin film layer R2 for a third inspection is formed on the substrate 300 during the deposition process shown in FIGS. 4C and 4D. It is noted, however, that the thin film layer R2 for the third inspection is formed at a location different from the marks M, such that the thin film layer R2 for the third inspection is not used for the first inspection. Further, the thin film layer R2 will not interfere with the first inspection.

When the emission layer 323_R of the red pixel R is formed using the first mask 210a, the first mask 210a is aligned on the substrate 300 and deposition is performed as seen in FIG. 4A. In this manner, thin film layers 301, 302, R1, and R2 of a red (R) color (hereinafter referred to as a first color) are formed on the substrate 300, as seen in FIG. 4C. An active area 301 and a dummy area 302 of the thin film layers of the first color are formed on areas of the substrate 300 that correspond to the first pixel patterns in the active area 211 and the dummy area 212 of the first mask 210a, respectively. Thin film layers R1 and R2 for the first inspection and the third inspection are formed on areas corresponding to the patterns R1' and R2' for inspecting the first and second pixel positions of the first mask 210a, respectively. The thin film layer corresponding to the active area 301 will become the emission layer 323_R of the red pixel R.

To inspect whether the thin film layers 301, 302, R1, and R2 of the first color including the emission layer 323_R of the red pixel R are accurately formed, the positions of the thin film layer R1 for the first inspection and the central points C1 and C2 associated with the marks M are compared as described with reference to FIG. 3. When it is determined that an offset of the first mask 210a exists as a result of the comparison, the position of the first mask 210a is adjusted so that the offset may be eliminated (or at least reduced) when the next thin film layers 301, 302, R1, and R2 of the first color are formed.

According to one or more exemplary embodiments, first mask 210a is used to form the emission layer 323_R of the pixel R may be used even when the emission layer 323_B of the pixel B is formed. It is contemplated, however, that the first mask 210a may be used to form the emission layer 323_R of the red pixel R, but not used to form the emission layer 323_B of the blue pixel B. In this manner, another first mask 210a may be used.

As illustrated in FIG. 4A, the first mask 210a is disposed over the substrate 300, and, as seen in FIG. 4B, the first mask 210a is shifted by a determined pitch and aligned with the substrate 300 based, at least in part, on the formation of the emission layer 323_R of the red pixel R. That is, because the emission layer 323_R of the red pixel R and the emission layer 323_B of the blue pixel B have the same pattern that would otherwise overlap each other if the emission layer 323_R of the red pixel R were moved by a determined pitch over the emission layer 323_B of the blue pixel B, the first mask 210a may be moved by the determined pitch to form the emission layer 323_B of the blue pixel B. As such, when the first mask 210a, which is used to form the emission layer 323_R of the red pixel R, is shifted by the determined pitch, the pattern of the emission layer 323_R of the red pixel R may be formed as the emission layer 323_B of the blue pixel B. The shift distance may be adjusted by 1 pitch, 3 pitches, etc., by taking into account the determined pitch. To this end, it is noted that the shifting of first mask 210a should be performed in a shifting direction within a width "d" of the dummy area.

Accordingly, as seen in FIG. 4B, when the first mask 210a is shifted by the determined pitch with respect to the substrate 300, the first pixel patterns of the active area and the dummy area 211 and 212 and the patterns R1' and R2' for inspecting the first and second pixel positions will also be shifted and aligned. As such, when a deposition process is performed, thin film layers 301, 302, B, and R2 of a blue (B) color (referred to hereinafter as a second color) are formed and are shifted from the thin film layers of the first color by the determined pitch, as seen by comparing FIGS. 4C and 4D. An active area 301 and a dummy area 302 of the thin film layers of the second color are formed on areas of the substrate 300 that correspond to the first pixel patterns of the active area 211 and the dummy area 212 of the first mask 210a, respectively. To this end, the thin film layer B for a second inspection and the thin film layer R2 for a third inspection are formed on areas that correspond to the patterns R1' and R2' for inspecting the first and second pixel positions of the first mask 210a, respectively. In this manner, the thin film layer corresponding to the active area 301 will become the emission layer 323_B of the blue pixel B.

To inspect whether the thin film layers 301, 302, B, and R2 of the second color and the emission layer 323_B of the blue pixel B are accurately formed, the positions of the thin film layer B of the second inspection and the central points C1 and C2 associated with the marks M are compared with each other as described with reference to FIG. 3. When it is determined that an offset of the first mask 210a exists as a result of the comparison, the position of the first mask 210a may be adjusted so that the offset may be canceled (or at least reduced) when the next thin film layers 301, 302, B, and R2 of the second color are formed.

The first mask 210a may also be used to form the hole injection layer 321_R, which is an auxiliary layer of the red pixel R.

FIGS. 5A, 5B, 5C, and 5D illustrate a method of patterning an emission layer of a first pixel and an auxiliary layer of the first pixel using the first mask of FIGS. 4A, 4B, 4C, and 4D, according to one or more exemplary embodiments. As previously mentioned, the first pixel may be a red pixel R, such that the emission layer of the first pixel may be emission layer 323R of the red pixel R and the auxiliary layer of the first pixel may be hole injection layer 321_R of the red pixel R.

Figure 5A:
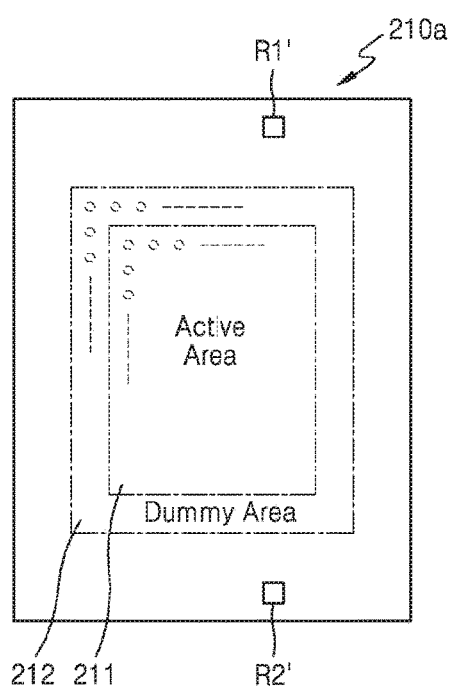
FIGS. 5A, 5B, 5C, and 5D illustrate a method of patterning an emission layer of a first pixel and an auxiliary layer of the first pixel using the first mask of FIGS. 4A, 4B, 4C, and 4D, according to one or more exemplary embodiments.
Figure 5B:
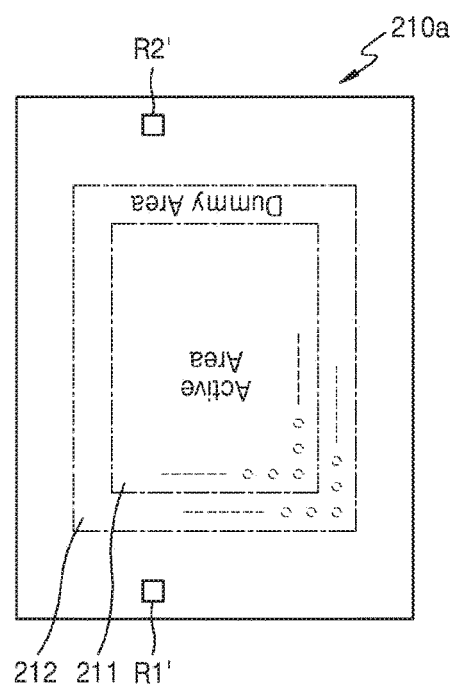
Figure 5C:
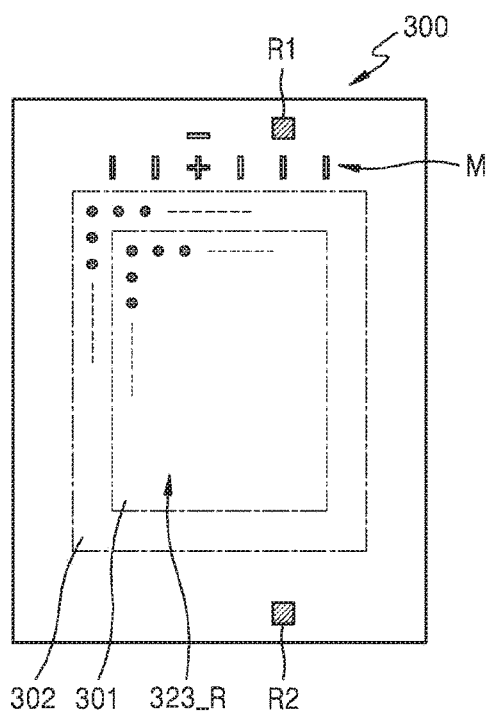
Figure 5D:
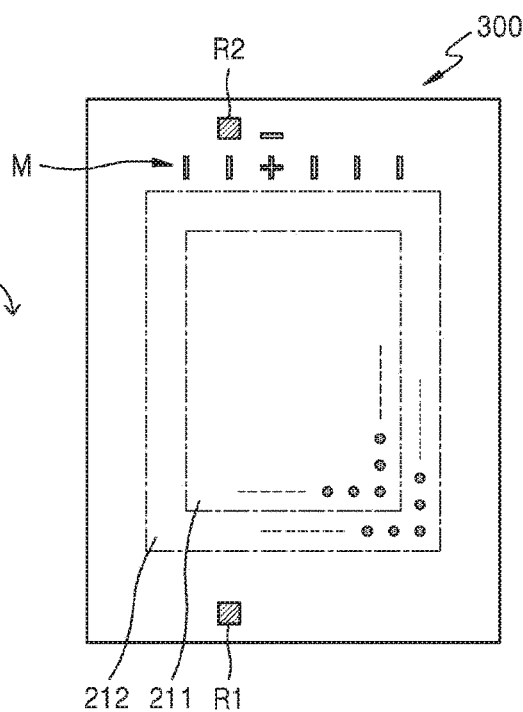

Referring to FIGS. 5A, 5B, 5C, and 5D, the thin film layers 301, 302, R1, and R2 of the first color are formed by disposing the first mask 210a over substrate 300 and performing deposition as in FIGS. 5A and 5C. After the thin film layers 301, 302, R1, and R2 of the first color are formed, a process of correcting an offset by comparing the positions of the thin film layer R1 for the first inspection and the central points C1 and C2 associated with the marks M is performed. The correction process is the same as described in FIGS. 4A and 4C, and, as such, duplicative descriptions are omitted to avoid obscuring exemplary embodiments.

The first mask 210a is used to form the hole injection layer 321_R, which is an auxiliary layer (referred to hereinafter as a first auxiliary layer) of the red pixel R. It is noted, however, that a portion of the first mask 210a used to form the emission layer 323_R of the red pixel R is different from a section portion of the first mask 210a used to form the hole injection layer 321_R of the red pixel. It is also contemplated that a different first mask may be utilized to form the hole injection layer 321_R of the red pixel R.

As illustrated in FIG. 5A, the first mask 210a is disposed over substrate 300. The first mask 210a is rotated by 180 degrees from a position associated with forming the emission layer 323_R of the red pixel R. To this end, the rotated configuration of first mask 210a is aligned with respect to the substrate 300. That is, because the emission layer 323_R of the red pixel R and the hole injection layer 321_R of the red pixel R are thin film layers of the same pattern formed in the same position, the first mask 210a of the same kind as the one used to form the emission layer 323_R of the red pixel R may be used. Also because a pattern of the same shape as the one used to form the emission layer 323_R of the red pixel R is repeatedly formed, the pattern may be maintained without change even when the first mask 210a is rotated by 180 degrees. It is noted, however, that some offset may occur, but this offset may be determined and adjusted for via the next offset correction process.

When the first mask 210a is rotated by 180 degrees, the above-described pattern R2' for inspecting the second pixel position corresponds to a position that may be compared with the mark M on the substrate 300. In this manner, when deposition is performed, the thin film layers 301, 302, R1, and R2 associated with the first auxiliary layer are formed as in FIG. 5D. The thin film layer corresponding to the active area 301 will become the hole injection layer 321_R of the red pixel R.

To inspect whether the thin film layers 301, 302, R1, and R2 of the first auxiliary layer including the hole injection layer 321_R of the red pixel R are accurately formed, the positions of the thin film layer R2 of the third inspection and the central points C1 and C2 of the marks M may be compared with each other as described with reference to FIG. 3. When it is determined that an offset of the first mask 210a exists as a result of the comparison, the position of the first mask 210a may be adjusted so that the offset may be canceled (or at least reduced) when the next thin film layers 301, 302, R1, and R2 of the first auxiliary layer are formed.

Although the formation of the emission layer 323_R of the red pixel R has been described first for descriptive convenience, the hole injection layer 321_R of the red pixel R is formed before the emission layer 323_R of the red pixel R based on the stacking sequence as described in association with FIG. 2. In this manner, because the emission layers 323_R of the red pixels R, the emission layers 323_B of the blue pixels B, and the hole injection layers 321_R of the red pixels R may be formed using the same first mask 210a, the potential for error decreases, as well as reducing in manufacturing time and cost. Moreover, it is easier to manage the overall manufacturing process.

FIGS. 6A, 6B, 6C, and 6D illustrate a method of patterning an emission layer of a third pixel and an auxiliary layer of the third pixel using a second mask, according to one or more exemplary embodiments. For instance, the emission layer of the third pixel may be emission layer 323_G of a green pixel G and the auxiliary layer of the third pixel may be hole injection layer 321_G of the green pixel G. The second mask will be referred to as mask 210b.

Given that the emission layer 323_G and the hole injection layer 321_G of the green pixel G have a pattern different from that of the red pixel R and the blue pixel B, the emission layer 323_G and the hole injection layer 321_G are not formed by shifting or rotating the first mask 210a, but, instead, are formed using a second mask 210b having second pixel patterns in the active area 213 and the dummy area 214, and patterns G1', G2' for inspecting third and fourth pixel positions for the green pixel G.

According to one or more exemplary embodiments, the second mask 210b is aligned on the substrate 300 as in FIG. 6A and deposition is performed. Thin film layers 303, 304, G1, and G2 of a green (G) color (referred to hereinafter as third color) are formed on the substrate 300 as in FIG. 6C. An active area 303 and a dummy area 304 of the thin film layer of the third color are formed on areas of the substrate 300 that correspond to the second pixel patterns in the active area 213 and the dummy area 214 of the second mask 210b, respectively. The thin film layers G1 and G2 for fourth and fifth inspection are formed on areas that correspond to the patterns G1' and G2' for inspecting the third and fourth pixel positions of the second mask 210b, respectively. The thin film layer corresponding to the active area 303 will become the emission layer 323_G of the green pixel G.

To inspect whether the thin film layers 303, 304, G1, and G2 of the third color including the emission layer 323_G of the green pixel G are accurately formed, the positions of the thin film layer G1 of the fourth inspection and the central points C1 and C2 associated with the marks M are compared with each other as described with reference to FIG. 3. When it is determined that an offset of the second mask 210b exists as a result of the comparison, the position of the second mask 210b may be adjusted so that the offset may be canceled (or at least reduced) when the next thin film layers 303, 304, G1, and G2 of the third color are formed.

The second mask 210b may also be utilized to form the hole injection layer 321_G, which is an auxiliary layer (referred to hereinafter as a second auxiliary layer) of the green pixel G. It is contemplated, however, that the second mask 210b used when the emission layer 323_G of the green pixel G is formed may not be used when the hole injection layer 321_G of the green pixel G is formed, but, instead, another second mask 210b may be used.

As illustrated in FIG. 6A, the second mask 210b is disposed over substrate 300. The second mask 210b is rotated by 180 degrees from a position of forming the emission layer 323_G of the green pixel G and aligned with respect to the substrate 300. That is, because the emission layer 323_G of the green pixel G and the hole injection layer 321_G of the green pixel G are thin film layers having the same pattern formed in the same position, the second mask 210b may be used. Further, because a pattern of the same shape is repeatedly formed, the pattern may be maintained without change even when the second mask 210b is rotated by 180 degrees. It is noted, however, that some offset may occur, but this offset may be adjusted via the next offset correction process.

Moreover, when the second mask 210b is rotated by 180 degrees, the above-described pattern G2' for inspecting the fifth pixel position corresponds to a position that may be compared with the mark M on the substrate 300. In this manner, when deposition is performed, the thin film layers 303, 304, G1, and G2 of the second auxiliary layer may be formed as in FIG. 6D. The thin film layer corresponding to the active area 303 will become the hole injection layer 321_G of the green pixel G.

To inspect whether the thin film layers 303, 304, G1, and G2 of the second auxiliary layer including the hole injection layer 321_G of the green pixel G are accurately formed, the positions of the thin film layer G2 of the fifth inspection and the central points C1 and C2 associated with the marks M are compared with each other as described with reference to FIG. 3. When it is determined that an offset of the second mask 210b exists as a result of the comparison, the position of the second mask 210b may be adjusted so that the offset may be canceled (or at least reduced) when the next thin film layers 303, 304, G1, and G2 of the second auxiliary layer are formed.

Although the formation of the emission layer 323_G of the green pixel G has been described first for descriptive convenience, the hole injection layer 321_G of the green pixel G is formed before the emission layer 323_G of the green pixel G based on a stacking sequence as described in association with FIG. 2. In this manner, because the emission layer 323_G of the green pixel G and the hole injection layer 321_G of the green pixel G may be formed using the same second mask 210b, the potential for error decreases, as well as reducing in manufacturing time and cost. Moreover, it is easier to manage the overall manufacturing process.

Accordingly, all of the emission layers 323_R, 323_G, and 323_B of the red, green, and blue pixels R, G, B, and the hole injection layers 321_R and 321_G of the red and green pixels R and G may be formed using two masks, e.g., the first mask 210a and the second mask 210b, in two different orientations. In this manner, exemplary embodiments enable the potential for error to decrease, as well as enable reductions in manufacturing time and cost. Moreover, it is easier to manage the overall manufacturing process and productivity may increase.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting display device comprising:
   a substrate;
   a first color emission layer on the substrate;
   a second color emission layer on the substrate, the second color emission layer being spaced apart from the first color emission layer by a determined pitch,
   a third color emission layer on the substrate, the third color emission layer being spaced apart from the first color emission layer and the second color emission layer,
   wherein, in a plan view, patterns of the first color emission layer and the second color emission layer are equivalent; and
   wherein, in a cross-sectional view, patterns of the first color emission layer and the second color emission layer are different from one another.

2. The organic light-emitting display device of claim 1, wherein:
   the substrate comprises:
     an active area in a central portion; and
     a dummy area outside the active area;
   the first emission layer is arranged in the active area; and
   the second emission layer is arranged in the active area and the dummy area.

3. The organic light-emitting display device of claim 1, wherein the determined pitch is less than or equal to a width of the dummy area in a direction of the determined pitch.

4. The organic light-emitting display device of claim 3, wherein, in the direction of the determined pitch, an end portion of the second emission layer is arranged in the dummy area.

5. The organic light-emitting display device of claim 1, wherein the first color emission layer comprises a red emission layer, the second color emission layer comprises a blue emission layer, and the third color emission layer comprises a green emission layer.

6. The organic light-emitting display device of claim 1, further comprising:
   a first pixel electrode on the substrate; and
   a second pixel electrode on the substrate,
   wherein, in a direction normal to the substrate, a distance between the first pixel electrode and the first color emission layer is greater than a distance between the second pixel electrode and the second color emission layer.

7. The organic light-emitting display device of claim 1, further comprising:
   a first alignment mark on the substrate;
   a second alignment mark on the substrate; and
   a third alignment mark on the substrate,
   wherein:
     a first imaginary line extends, in a plan view, through the first color emission layer, the second color emission layer, and the first alignment mark;
     a second imaginary line crossing the first imaginary line extends, in the plan view, through the first color emission layer; and
     a third imaginary line crossing the first imaginary line extends, in the plan view, through the second color emission layer.

8. The organic light-emitting display device of claim 7, further comprising:
   a fourth alignment mark on the substrate,
   wherein:
     a fourth imaginary line extends, in the plan view, through the second alignment mark, the third alignment mark, and the fourth alignment mark; and
     a fifth imaginary line crossing the fourth imaginary line extends, in the plan view, through the first alignment mark and the fourth alignment mark.

9. The organic light-emitting display device of claim 8, wherein:
   shapes of the first alignment mark, the second alignment mark, and the third alignment mark are equivalent; and
   shapes of the first alignment mark and the fourth alignment mark are different.

10. An electroluminescent display device comprising:
    a substrate comprising:
      an active area in a central portion; and
      a dummy area outside the active area;
    a first color emission layer on the substrate in the active area;
    a second color emission layer on the substrate in the active area and the dummy area, the second color emission layer being spaced apart from the first color emission layer,
    wherein patterns of the first color emission layer and the second color emission layer are equivalent.

11. The electroluminescent display device of claim 10, wherein the patterns of the first color emission layer and the second color emission layer are equivalent in a plan view.

12. The electroluminescent display device of claim 10, wherein a pitch between the first color emission layer and the second color emission layer is less than or equal to a width of the dummy area in a direction of the pitch.

13. The electroluminescent display device of claim 12, wherein, in the direction of the pitch, an end portion of the second emission layer is arranged in the dummy area.

14. The electroluminescent display device of claim 10, further comprising:

a third color emission layer on the substrate, the third color emission layer being spaced apart from the first color emission layer and the second color emission layer.

15. The electroluminescent display device of claim 14, wherein the first color emission layer comprises a red emission layer, the second color emission layer comprises a blue emission layer, and the third color emission layer comprises a green emission layer.

16. The electroluminescent display device of claim 10, further comprising:
   a first alignment mark on the substrate;
   a second alignment mark on the substrate; and
   a third alignment mark on the substrate,
   wherein:
      a first imaginary line extends, in a view normal to the substrate, through the first color emission layer, the second color emission layer, and the first alignment mark;
      a second imaginary line crossing the first imaginary line extends, in the view, through the first color emission layer; and
      a third imaginary line crossing the first imaginary line extends, in the view, through the second color emission layer.

17. The electroluminescent display device of claim 16, further comprising:
   a fourth alignment mark on the substrate,
   wherein:
      a fourth imaginary line extends, in the view, through the second alignment mark, the third alignment mark, and the fourth alignment mark; and
      a fifth imaginary line crossing the fourth imaginary line extends, in the view, through the first alignment mark and the fourth alignment mark.

* * * * *